US 9,928,897 B2

(12) United States Patent
Bacchus et al.

(10) Patent No.: US 9,928,897 B2
(45) Date of Patent: Mar. 27, 2018

(54) MEMORY MODULE VOLTAGE REGULATOR MODULE (VRM)

(71) Applicant: HEWLETT PACKARD ENTERPRISE DEVELOPMENT LP, Houston, TX (US)

(72) Inventors: Reza M. Bacchus, Houston, TX (US); Melvin K. Benedict, Houston, TX (US); Stephen F. Contreras, Houston, TX (US); Eric L. Pope, Houston, TX (US); Chi K. Sides, Houston, TX (US); Chun-Pin Huang, Taipei (TW)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,070

(22) PCT Filed: Feb. 27, 2015

(86) PCT No.: PCT/US2015/018054
§ 371 (c)(1),
(2) Date: Jan. 30, 2017

(87) PCT Pub. No.: WO2016/137503
PCT Pub. Date: Sep. 1, 2016

(65) Prior Publication Data
US 2017/0243626 A1    Aug. 24, 2017

(51) Int. Cl.
*G11C 5/06*     (2006.01)
*G11C 11/4074*  (2006.01)
*G11C 5/10*     (2006.01)

(52) U.S. Cl.
CPC ............ *G11C 11/4074* (2013.01); *G11C 5/06* (2013.01); *G11C 5/10* (2013.01)

(58) Field of Classification Search
CPC ........................................................ G11C 5/06
USPC ........................................................ 365/51, 63
See application file for complete search history.

(56) References Cited

U.S. PATENT DOCUMENTS

| 6,051,964 | A    | 4/2000  | Brown et al. |
| 6,310,792 | B1   | 10/2001 | Drobnik |
| 6,594,556 | B1   | 7/2003  | Agatstein et al. |
| 7,360,104 | B2   | 4/2008  | Harris et al. |
| 7,876,592 | B2 * | 1/2011  | Berke ............ G11C 5/04 365/189.05 |
| 7,919,840 | B2   | 4/2011  | Malik |

(Continued)

FOREIGN PATENT DOCUMENTS

WO    WO-2012135772 A2    10/2012

OTHER PUBLICATIONS

International Search Report and Written Opinion; PCT/US2015/018054; dated Nov. 27, 2015; 13 pages.

(Continued)

*Primary Examiner* — Son Mai
(74) *Attorney, Agent, or Firm* — Hewlett Packard Enterprise Patent Department

(57) ABSTRACT

An example device in accordance with an aspect of the present disclosure includes a memory module having a voltage regulator module (VRM) to receive input power and deliver output power to components of the memory module at a first power plane. At least one stitching capacitor is to couple the first power plane to a second power plane.

15 Claims, 8 Drawing Sheets

(56) References Cited

U.S. PATENT DOCUMENTS

| | | | |
|---|---|---|---|
| 2005/0135182 A1* | 6/2005 | Perino | G06F 13/423 |
| | | | 365/230.06 |
| 2009/0002952 A1* | 1/2009 | Mesmer | G09G 5/006 |
| | | | 361/720 |
| 2010/0128447 A1* | 5/2010 | MacDougall | G11C 5/04 |
| | | | 361/737 |
| 2012/0198136 A1 | 8/2012 | Moshayedi et al. | |
| 2013/0096724 A1 | 4/2013 | Divan | |
| 2014/0139969 A1 | 5/2014 | Hwang et al. | |

OTHER PUBLICATIONS

Texas Instruments;PCB Design Requirements for VDD_MPU_IVA Power Distribution Network for TI OMAP3630, AM37xx, and DM37xx Microprocessors, (Research Paper); Jun. 2011; 18 Pages.

* cited by examiner

MEMORY MODULE VOLTAGE REGULATOR MODULE (VRM)

BACKGROUND

Long distances in power distribution from a motherboard to a memory module can be associated with issues such as high direct current (DC) voltage drops and inductances. Such issues can decrease memory output stability, reliability, and other characteristics associated with the memory module and motherboard.

BRIEF DESCRIPTION OF THE DRAWINGS/FIGURES

DETAILED DESCRIPTION

A memory module with a Voltage regulator module (VRM) and an associated power distribution network (PDN) is to provide voltage to memory module components, such as dynamic random-access memory (DRAM) chips. The long PDN path from a voltage regulator module (VRM) on the motherboard to active device chips (DRAMs) on the memory module creates high DC power loss and power noise due to high DC resistance and AC impedance of the PDN. A VRM on the motherboard may be used to provide power/voltage for a processor, such as a central processing unit (CPU) with integrated memory controller hub (MCH), as well as all the memory modules for that motherboard. Accordingly, the VRM on the motherboard has to provide a relatively high current output (e.g., 50-90 Amps (A) output current), e.g., to support at least two channels of memory module support. Such a relatively large motherboard VRM may include 2-3 or more phases (pulse width modulation (PWM) controller and power metal-oxide-semiconductor field-effect transistors (MOSFETs), increasing component cost for the motherboard compared to using a less robust regulator such as a single-phase VRM on the motherboard. Such costs may multiply, for motherboards having, e.g., four VRMs to support a total of 24 memory module slots. Each motherboard VRM would provide on the order of 54 A, split between six memory modules (approximately 41 A) and the CPU/MCH (the remaining 13 A). The distance from the motherboard VRM to a farthest motherboard memory module connector may be approximately four inches, exacerbating the voltage drop and power noise to worsen the power/voltage quality at the memory modules. Furthermore, the greater power capacity of the numbers of memory modules that a given motherboard supports, results in a need for larger corresponding power delivery support (more robust VRMs for higher continuous output current support, larger motherboard power pads, additional bulk decoupling capacitors, and so on) needed at the motherboard, further increasing costs.

Examples described herein enable approaches to shorten the PDN distance, by using a VRM on the memory module, enabling the motherboard to use a simple voltage regulator (e.g., a lower capacity and low cost single-phase, DC-DC voltage regulator). This decreases the system costs, and reduces DC power loss and power noise in the power delivery to the components of the memory module (e.g., DRAMs).

Figure 1:
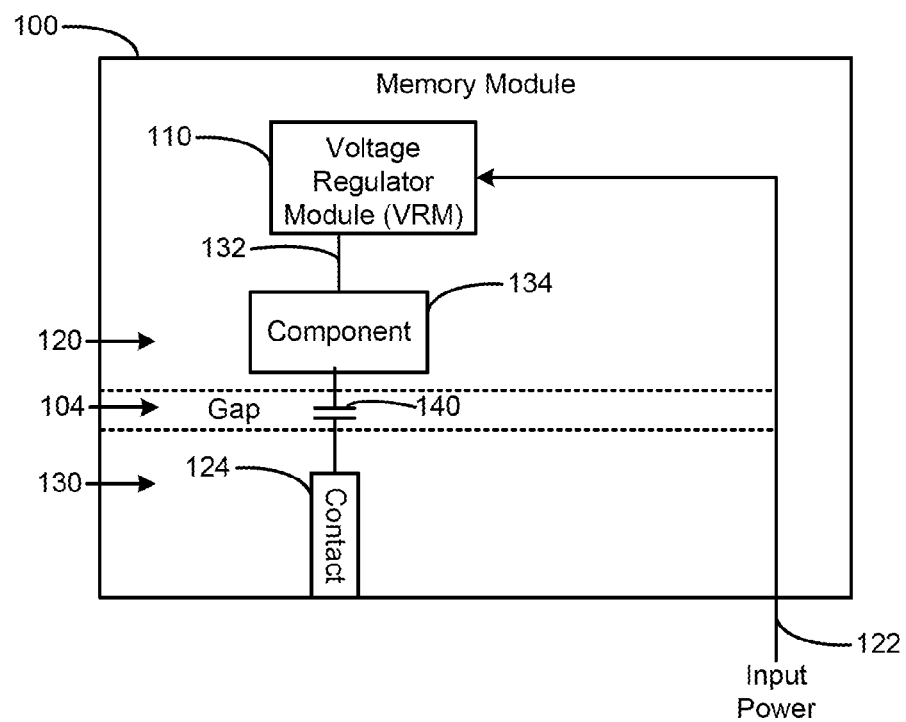
FIG. 1 is a block diagram of a memory module including a first power plane and a second power plane according to an example.

FIG. 1 is a block diagram of a memory module 100 including a first power plane 120 and a second power plane 130 according to an example. The memory module 100 also includes a voltage regulator module (VRM) 110. The VRM 110 is to receive input power 122, and provide output power 132. The output power 132 is provided to at least one component 134 of the memory module 100. The output power 132 and component(s) 134 are associated with the first power plane 120, and are isolated electrically by a gap 104 from the second power plane 130. At least one contact 124 is associated with the second power plane 130. A sufficient number of stitching capacitors 140 are to couple the first power plane 120 to the second power plane 130.

The memory module 100 may be a dual in-line memory module (DIMM) that may include a power distribution network (PDN) and dynamic random access memory (DRAM) chips for storing data. In an example, the memory may be a DIMM having a 72-bit wide data interface, such as double data rate fourth generation synchronous dynamic random-access memory (DDR4 SDRAM), and its follow-ons like DDR4e, DDR5, etc. In alternate examples, any type of memory media may be used. Thus, memory may include discrete/removable memory modules, as well as embedded memory systems. Other types of memory module 100 include a custom module, such as a mini DIMM interface, a small-outline DIMM (SODIMM) interface, or other types of memory technology, including those other than DRAM, such as nonvolatile memory, low-power double data rate synchronous DRAM for mobile computers (LPDDRx), hybrid memory and other memory attachment interfaces compatible with the examples described herein. For the example of FIG. 1, memory module 100 is a DDR4 memory module operating according to an output power 132 of VDD=1.2 V associated with the first power plane 120, and is based on an input power 122 of approximately 12 V received by the VRM 110.

As illustrated, the memory module 100, which may be based on a VDD power plane, is separated as including two different power planes, first power plane 120 and second power plane 130. The power planes 120, 130 can relate to a component supply voltage (VDD) reference plane for command, control, and/or address signals. Splitting the VDD plane raises the possibility of electromagnetic interference (EMI) and signal integrity (SI) issues. The stitching capacitors 140 may bridge the gap 104 between the first and second planes 120, 130, to avoid EMI and SI issues. As illustrated in FIG. 1, the stitching capacitor(s) are coupled across the gap 104 between a memory module contact 124 (e.g., a gold-finger pin contact) and a shape associated with the VDD power plane 120 that powers the memory module component(s) 134.

The gap 104 enables the memory module's first power plane 120 to be disconnected from a motherboard power plane associated with the contact 124 and the second power plane 130. Thus, the memory module 100 may provide power to the first power plane 120 and its components via the VRM 110 on the memory module 100, rather than receiving such power from the motherboard. However, the stitching capacitor 140 is to enable an alternating current (AC) connection between the first and second power plane 120, 130, to provide a return path for signals from the memory module 100 to the motherboard.

The stitching capacitors 140 enable preservation of signal integrity for the return path signals. The stitching capacitors 140 enable memory signal return paths for the AC current/signals to pass across the stitching capacitors 140. The stitching capacitors 140 may be appropriately numbered and/or sized for carrying such address command signals, e.g., as a function of the various components 134 on the memory module 100 generating such signals. In an example, the stitching capacitor 140 may be on the order of 10-100 nanofarads (nF) or other appropriate value for stitching capacitors. Furthermore, on in the order of dozen of stitching capacitors 140 may be used to provide a sufficient number of capacitors.

Thus, the benefit of including the VRM 110 on the memory module 100, and accommodated return signals from the components 134 using stitching capacitors 104, enables cost savings for systems, in that a system does not need unused or over-capacity voltage regulators. If six memory modules are used on a motherboard with 24 memory slots, the system will have six total on-memory VRMs, and a low capacity VRM on the motherboard, much lower in cost compared to the motherboard having much higher capacity motherboard VRMs to accommodate all 24 memory slots (and associated infrastructure and support). Furthermore, signal integrity of memory modules 100 having on-board VRMs 110 also will be comparatively improved, because less power and less electrical noise is being moved across the memory-motherboard interface. Accordingly, there is less noise and less opportunity for noise to couple itself onto the memory signals, especially important as memory data rates increase.

Figure 2:
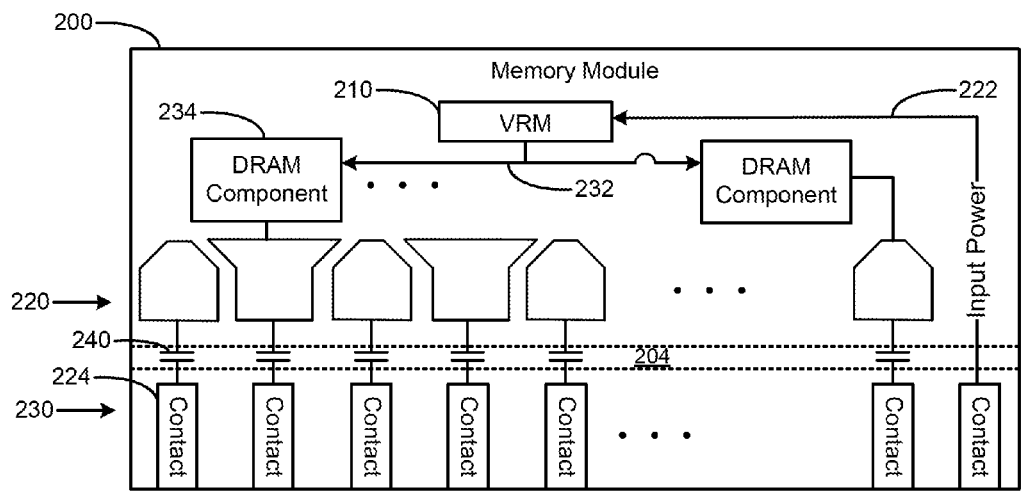
FIG. 2 is a block diagram of a memory module including a first power plane and a second power plane according to an example.

FIG. 2 is a block diagram of a memory module 200 including a first power plane 220 and a second power plane 230 according to an example. The memory module 200 also includes a VRM 210 to receive input power 222, and provide output power 232 to at least one component 234 of the memory module 200. The first power plane 220 is isolated electrically from the second power plane 230 by a gap 204. A sufficient number of stitching capacitors 240 are to couple the first power plane 220 to at least one contact 224 associated with the second power plane 230.

The VRM 210 may be implemented as a separate chip on the memory module 200, and also could be implemented by integrating the VRM 210 into other existing parts/components of the memory module 200. For example, the VRM 210 may be integrated into the serial presence detect (SPD) chip/component of the memory module 200, by adding voltage controllers to the SPD chip. In alternate examples, the VRM 210 may be integrated into a register chip component of the memory module 200, or other components of memory module host logic.

The memory module 200 includes components related to power distribution, such as coupling/decoupling capacitors (not specifically shown). However, the stitching capacitors 240 are distinct from decoupling capacitors, as part of the power distribution network typically associated with smoothing power delivery (in contrast to return address/command signals) at the various memory module components.

The gap 204 is shown extending across a horizontal dimension of the memory module 200, to isolate the first power plane 220 from the second power plane 230. However, the gap 204 may extend in other directions, such as along a stack-up of the memory module printed circuit board (transitioning across/through its multiple layers). The gap 204 may be sized according to manufacturing specifics, appropriate to provide isolation between the planes without being too narrow or to short. In an example, the gap 204 may extend across the memory module 200 for a distance on the order of 10-30 mils.

Figure 3:
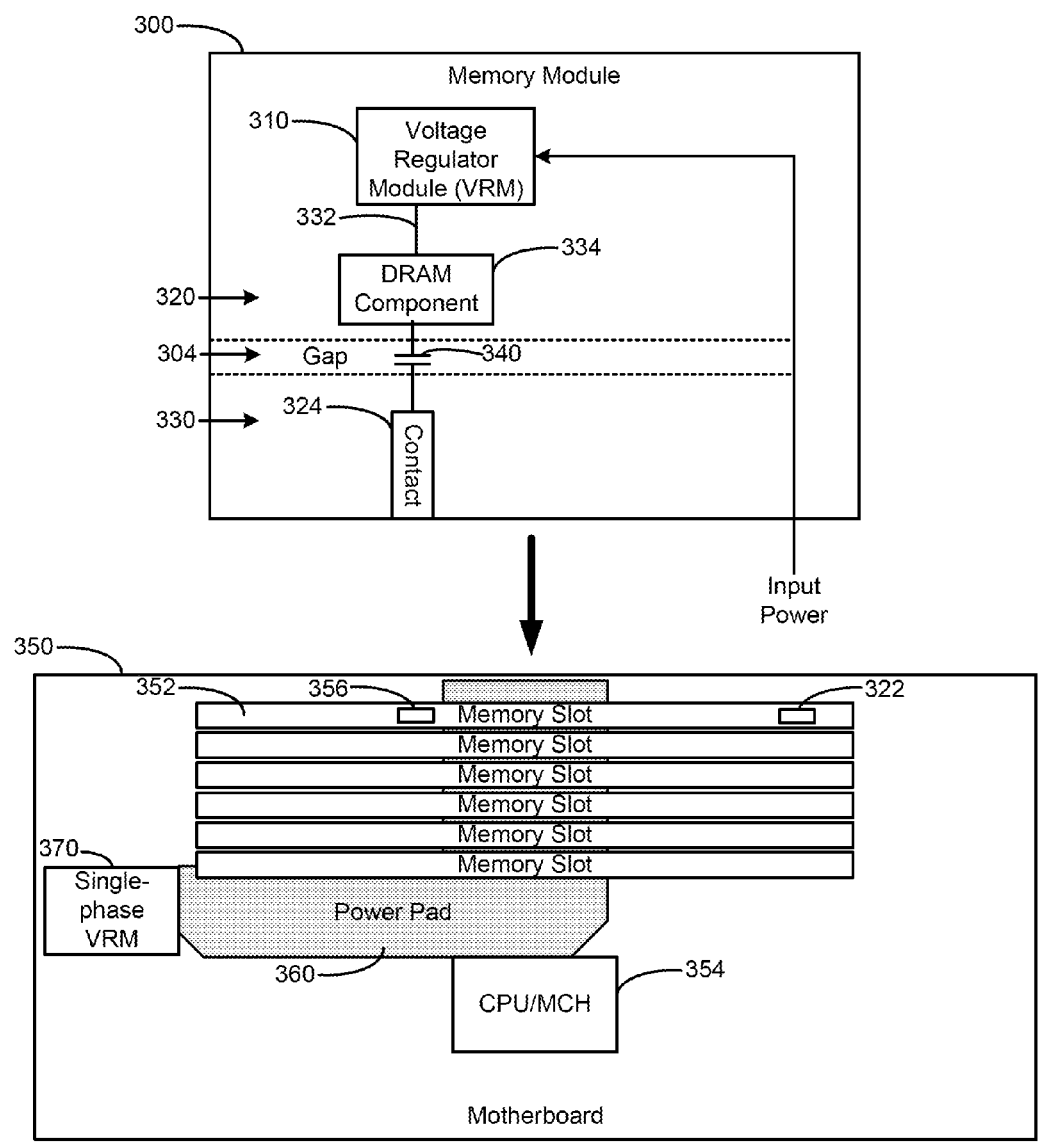
FIG. 3 is a block diagram of a system including a memory module and a motherboard according to an example.

FIG. 3 is a block diagram of a system including a memory module 300 and a motherboard 350 according to an example. The motherboard 350 includes a memory slot 352 to receive the memory module 300. The motherboard 350 provides power (including input power 322 and motherboard output power 356) via a power pad 360 to the memory slots 352 and to a processor/memory controller (CPU/MCH) 354 using a single-phase VRM 370. The memory module 300 includes a VRM 310 to receive input power 322, and provide output power 332 to at least one component 334 of the memory module 300. The first power plane 320 is isolated electrically from the second power plane 330 by gap 304. A sufficient number of stitching capacitors 340 are to couple the first power plane 320 to at least one contact 324 associated with the second power plane 330. The contacts 324 of the memory module 300 may interface electrically with the memory slot 352 of the motherboard 350.

To reduce the loop resistance and inductance associated with the various power planes 320, 330 (and others including VDD and/or ground (GND) planes), the motherboard 350 may use a relatively small source of power such as a basic cost-effective DC-DC regulator such as a single-phase VRM 370, to provide relatively small amounts of power (e.g., 10 A or less) for the CPU/MCH 354. The memory modules 300 may power their components 334 (e.g., DRAM chips), by using the VRM 310 on the memory module 300. As an example, the VRM 310 on the memory module 300 may provide a capacity on the order of 8-10 A or less. Thus, the example motherboard VRM 370 may avoid a need to have, e.g., a 90 A capacity, by virtue of not needing to provide power to the memory modules. Thus, the motherboard 350 can enjoy savings of PCB real-estate, smaller and less complex components, VRMs needing fewer phases, and generally less power support infrastructure such as power decoupling capacitors.

The single-phase VRM 370 does not need to be a high-capacity bulky voltage regulator to provide power to a group of memory modules that may be large power-consuming DIMMs. Rather, the memory module 300 itself includes the VRM 310 to provide power to the memory module 300. Additionally, the VRM 310 may be sized specifically for the particular number and type of memory module components 334 on a given memory module 300. Thus, a DIMM having eight DRAM components 334 may use a lower capacity VRM 310, compared to another DIMM having, e.g., 144 components whose VRM 310 needs to be scaled up accordingly for powering that particular DIMM. Thus, these approaches enable additional savings by virtue of customizing the power capacity on a per-memory module basis.

The VRM 370 is illustrated in terms of being a single-phase VRM 370, which is associated with providing very stable power but at a reduced power output (on the order of 10 A). Alternatively, the VRM 370 may rely on multiple phases, without a need for high capacity power output such as 50-60 amps. The VRM 370 therefore enables lower power, lower capacity, and lower cost. The lower characteristics associated with the single-phase VRM 370 do not cause an issue with stability or power ripple, because a large power output is not demanded from the single-phase VRM 370 according to the examples described herein.

Use of the reduced capacity motherboard VRM 370, along with the VRM 310 on the memory module, results in a total distance reduction for signals of the memory module components to travel. Signals no longer need to travel as much as approximately eight inches, based on four inches across the motherboard (from the motherboard VRM 370 to the memory module 300), and then another three-to-four inches from the entrance to a given memory module 300 to the farthest memory module component 334. Rather, by using the VRM 310 on the memory module 300, the signals need to travel less than six inches total, comparatively reducing the power loss associated with distance. Additionally, examples described herein avoid the complexity of running the power through the memory slot connectors.

The motherboard power pad 360 also may be comparatively reduced, because it no longer has to accommodate the increased power of a large capacity motherboard VRM 370. Rather, the power pad 360 has the capability of accommodating the reduced power of the single-phase or other appropriate capacity motherboard voltage regulator 370. The reduced size of the power pad 360 enables additional routing resources on the motherboard 350, avoiding a need for as much of the memory slot 352 to be surrounded by the power pad 360, freeing up PCB real-estate for additional signal traces. Additionally, the power pad 360 is associated with fewer split planes being needed on the motherboard 350, and improved integrity of the existing planes, even if the additional space (freed up due to the reduced-sized power pads 360) is not specifically used for routing.

The power pad 360 may accommodate various dimensions, such as being wider, without carrying as much current, to avoid wasting power due to DC loss and heat. The power pad 360 is to be wide enough so that the return current path of AC signals can be routed over it, while also providing sufficient power distribution. Generally, the power pad 360 is relatively narrower by needing to carry relatively less current. The power pad 360 also may be made relatively thinner, because it carries a relatively reduced current density. The power pad 360 does not need to accommodate full DC power, and can accommodate the return AC signals (a relatively lower AC impedance). Because the power pad 360 carries relatively less current, it generates relatively less heat for the system, avoiding rises in system temperatures.

The motherboard may provide the reference output power 356, and the input power 322, in addition to providing the AC return signal paths on the command address bus. The reference output power 356 may be provided as a sense point for the VRM 310 on the memory module 300 to track the voltage at the memory module pins of the memory slot 352 of the motherboard 350. Thus, the VRM 310 may identify whether its output power 332 is reasonably close to the reference output power 356 from the motherboard 350 for driving purposes (e.g., to drive data from the memory module 300 to the CPU/MCH 354). Thus, the memory module 300 may operate properly on a given motherboard 350 platform. The VRM 310 can reasonably match the reference output power 356 within acceptable tolerances according to a given design application and chosen working voltages of a system. The stitching capacitors 340 may transmit AC signals from the first power plane 320 of the memory module 300 to a reference power plane, associated with the reference output power 356 tied to the motherboard, via the contact 324.

Thus, the stitching capacitors 340 avoid directly joining the two power planes 320, 330 together. Accordingly, the stitching capacitors 340 avoid putting stress on the two VRMs 310, 370, by avoiding directly joining them to each other via the two power planes 320, 330 and avoiding any differences between the power planes (e.g., imposing a slightly different voltage from one VRM directly onto the other).

Furthermore, the stitching capacitors 340 enable the memory module 300 to be backward compatible with existing motherboards, e.g., those having their own full-fledged high capacity voltage regulators 370 on the motherboard 350. Accordingly, the examples describe herein enjoy the benefit of being compatible with an existing motherboard, while ensuring an upgrade path to transition to a new motherboard taking full advantage of the stitching capacitors 340 and associated benefits of reduced component cost of the motherboard 350. Thus, the memory modules 300 may include a form-factor that is backward-compatible with memory slots 352 of existing motherboards 350, so users may begin using the example memory modules 300 without needing a new motherboard 350.

Figure 4:
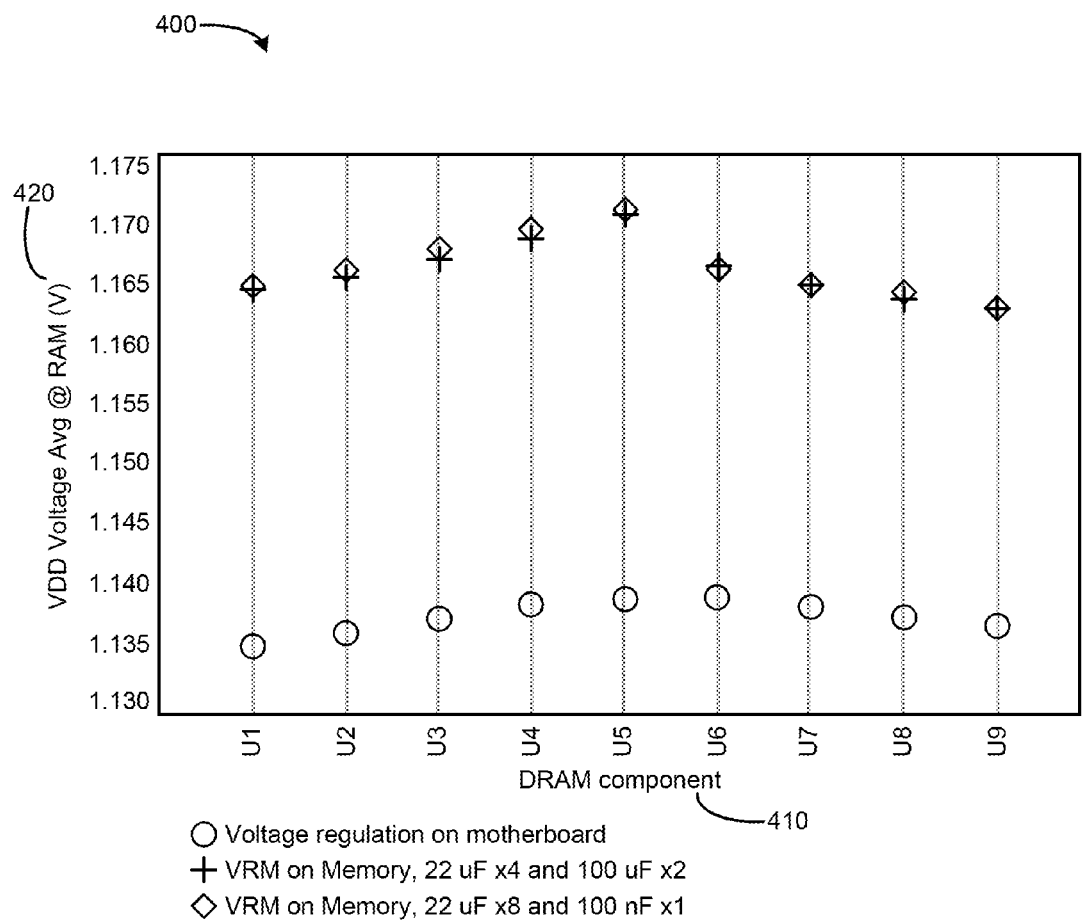
FIG. 4 is a chart of voltage as a function of memory module components according to an example.

FIG. 4 is a chart 400 of voltage 420 as a function of memory module components 410 according to an example. The circle symbols represent voltage values provided to a given DRAM component 410 (U1, U2, . . . U9) by a voltage regulator on the motherboard, i.e., benchmark values demonstrated without the use of the illustrated examples having a VRM on the memory module. The plus symbols and the diamond symbols represent voltages provided by a VRM on the memory module. For the plus symbols, the memory module includes four 22 microfarad (μF) capacitors, and two 100 μF capacitors. For the diamond symbols, the memory module includes eight 22 μF capacitors, and one 100 nanofarad (nF) capacitor. Such capacitors are not stitching caps, but rather they are different combinations of decoupling capacitors forming part of the power distribution network of the memory module.

The data of FIG. 4 illustrates a DC-drop comparison, illustrating the DC-drops associated with the improvements to resistance of copper and inter-connections according to the various example benefits described herein of having the VRM on the memory module. A VDD voltage value is shown for DRAM component dies. The sense point for the VRM on the motherboard has been taken into account to compensate for the corresponding voltage drop on the motherboard. Accordingly, the illustrated results show an improvement of approximately 3% voltage increase when putting the VRM on the memory module. The DC-drop improvement is up to 5% when not considering the voltage compensation (sense point) on the motherboard.

Figure 5:
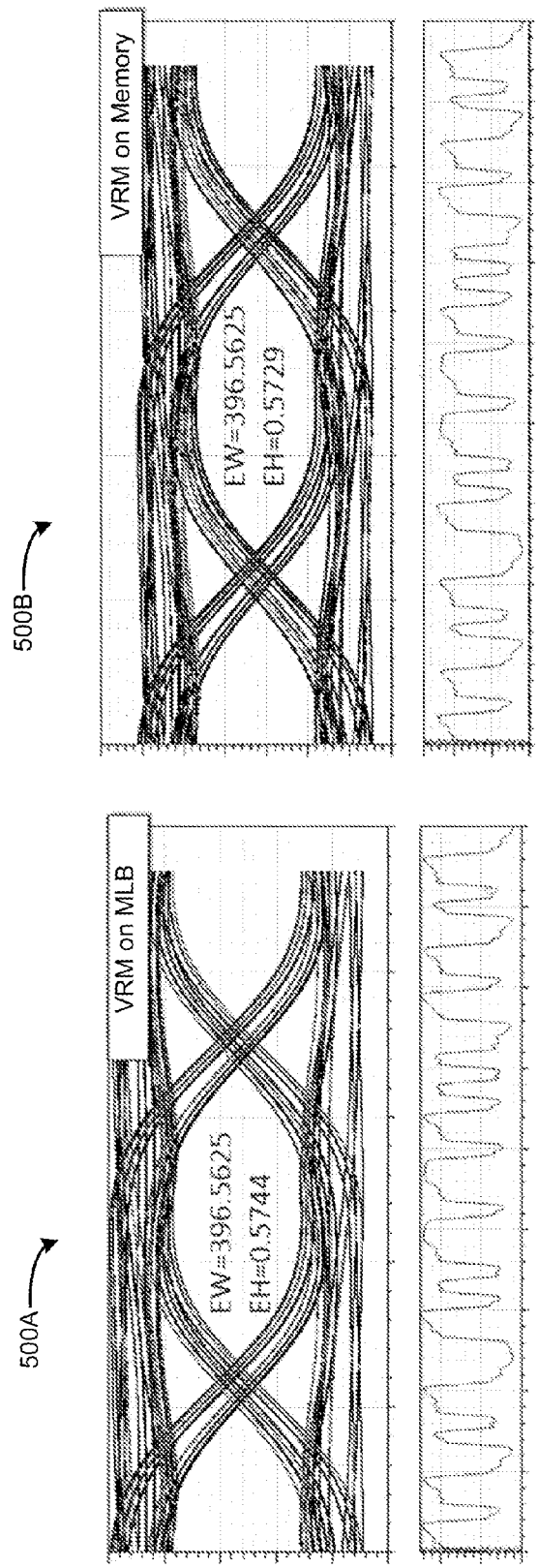
FIG. 5 illustrates a first eye chart for a voltage regulator module (VRM) on a motherboard (MLB), and a second eye chart for a VRM on a memory module.
Figure 6:
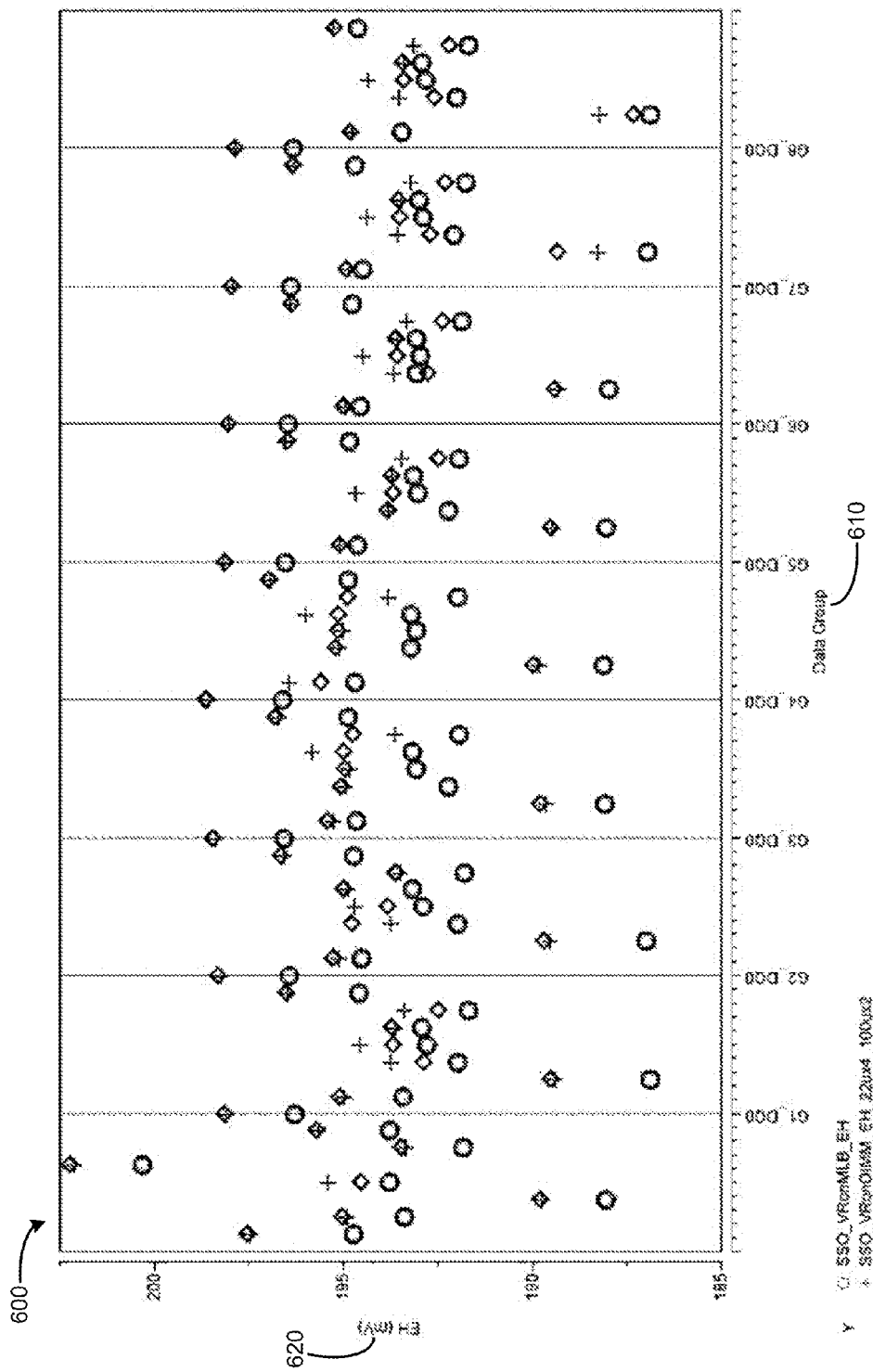
FIG. 6 is a chart of eye height in millivolts as a function of data group.
Figure 7:
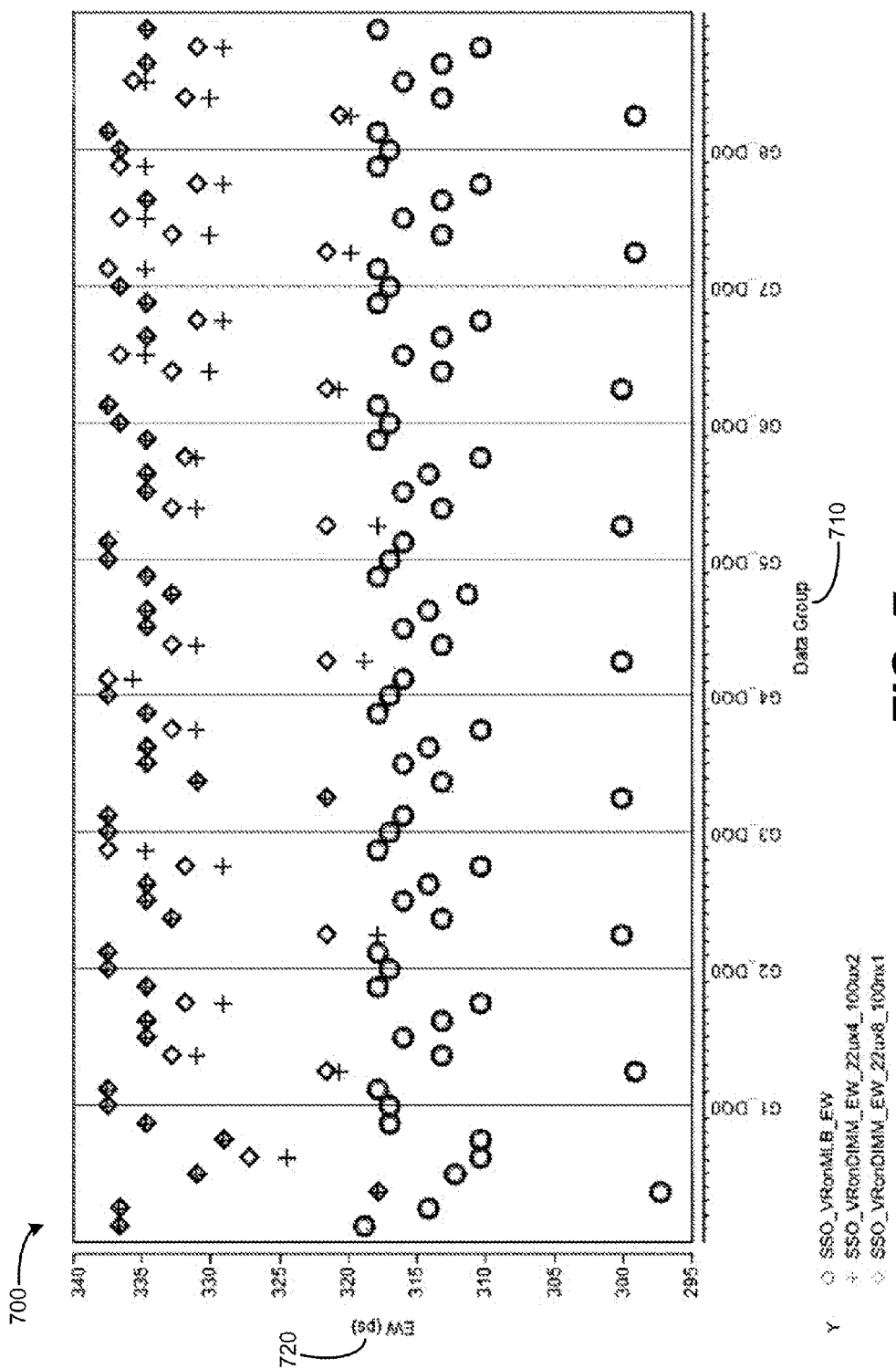
FIG. 7 is a chart of eye width in picoseconds as a function of data group.

FIG. 5 illustrates a first eye chart 500A for a voltage regulator module (VRM) on a motherboard (MLB), and a second eye chart 500B for a VRM on a memory module. The first eye chart 500A is associated with an eye width (EW) of 396.5625 picoseconds (ps), and an eye height (EH) of 0.5744 millivolts (mV). The second eye chart 500A is associated with an EW of 396.5625 ps, and an EH of 0.5729 mV. Accordingly, use of the VRM on memory does not result in noticeable degradation in the signals. Further specific details as to the data of the eye charts 500A, 500B are also illustrated in FIGS. 6-7.

The eye charts 500A, 500B are also referred to as address signal eye diagrams to provide Eye-Height (EH) and Eye- Width (EW) comparisons between VRM on motherboard and VRM on memory module. The eye charts 500A, 500B show simultaneous switching noise (SSN) analysis to identify the improvement for VRM on memory module in the time domain. For clarity, the eye charts 500A, 500B assume that the length on each data signal is the same.

The eye chart results for the address signals shown in eye chart 500B correspond to use of 10 nF stitching capacitors (e.g., one stitching capacitor for each gold finger pin contact on a memory module), to couple across the gap between first and second power (VDD) planes. Comparing between the two eye charts 500A, 500B shows that the VRM on the memory module (eye chart 500B) is slightly better and no worse in terms of the signal quality on the eye.

The eye charts 500A, 500B show results for the command address bus of the memory module, showing that the stitching capacitors do not degrade these address and command signals. The EH is slightly smaller on the eye chart 500B, because of the effect of the stitching capacitors allowing the signals to jump across the first and second power planes with little to no signal degradation.

FIG. 6 is a chart 600 of eye height (EH) 620, in millivolts (mV), as a function of data group 610. The circle symbols represent voltage values for a given data group 610 (G1_DQ0, G2_DQ0, . . . G8_DQ0) by a voltage regulator on the motherboard, i.e., benchmark values demonstrated without the use of the illustrated examples having a VRM on the memory module. The plus symbols and the diamond symbols represent voltages provided based on a VRM on the memory module. For the plus symbols, the memory module includes four 22 μF capacitors, and two 100 μF capacitors. For the diamond symbols, the memory module includes eight 22 μF capacitors, and one 100 nF capacitor. Such capacitors are not stitching caps, but rather they are different combinations of decoupling capacitors forming part of the power distribution network of the memory module.

The data in FIG. 6 shows the eye height (EH) comparison on data groups, comparing an example of having the VRM on the motherboard, vs. two examples of having the VRM on the memory module. There is a 6% Eye-Height improvement when using the VRM on the memory module. As for the data groups 610, the example data bus has eight groups, where a group is associated with a chip (e.g., DRAM component of the memory module). Each chip has 8 signals, for 8×8=64 signals total.

FIG. 7 is a chart 700 of eye width (EW) 720 in picoseconds (ps) as a function of data group 710. The circle symbols represent voltage values for a given data group 710 (G1_DQ0, G2_DQ0, . . . G8_DQ0) by a voltage regulator on the motherboard, i.e., benchmark values demonstrated without the use of the illustrated examples having a VRM on the memory module. The plus symbols and the diamond symbols represent voltages provided based on a VRM on the memory module. For the plus symbols, the memory module includes four 22 μF capacitors, and two 100 μF capacitors. For the diamond symbols, the memory module includes eight 22 μF capacitors, and one 100 nF capacitor. Such capacitors are not stitching caps, but rather they are different combinations of decoupling capacitors forming part of the power distribution network of the memory module.

The data of FIG. 7 shows the Eye Width (EW) comparison. The VRM on memory module has a 1% improvement on Eye Width, compared to having the VRM on the motherboard. As for the data groups 710, the data bus has 8 groups, and each group corresponds to a chip. A chip has 8 signals, for 8×8=64 signals total.

Figure 8:
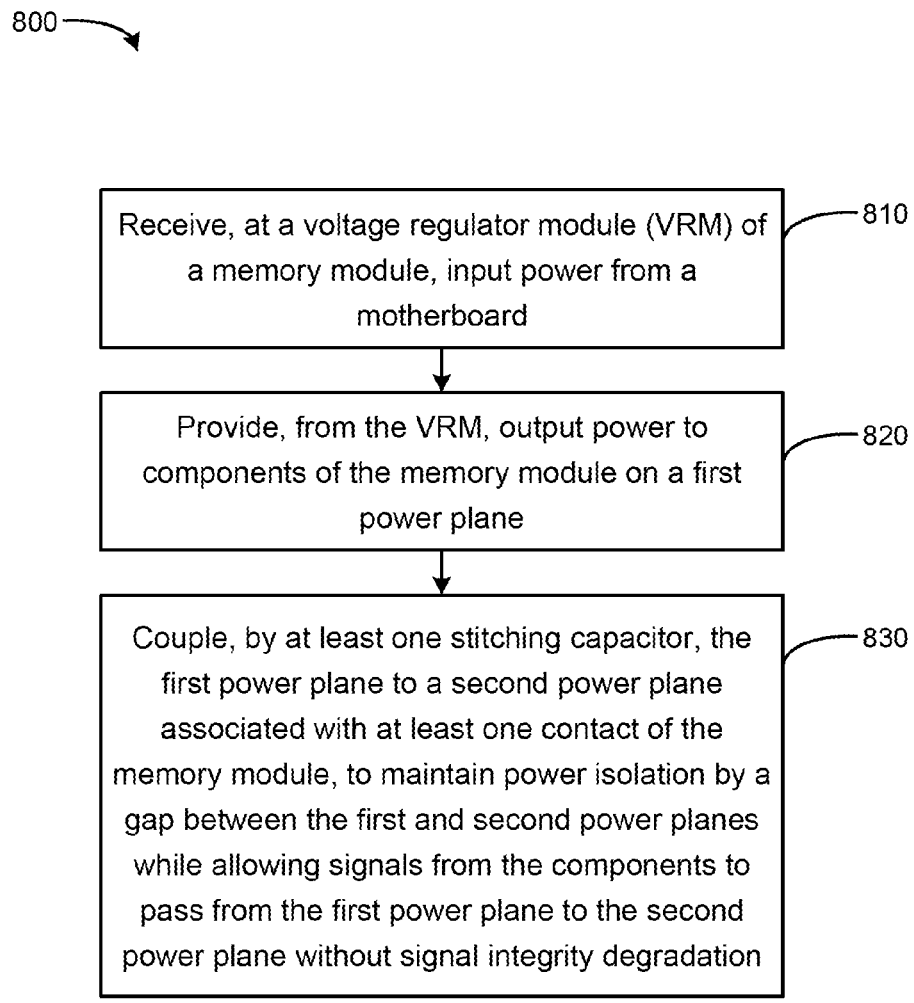
FIG. 8 is a flow chart based on coupling first and second power planes by at least one stitching capacitor according to an example.

Referring to FIG. 8, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 8 is a flow chart based on coupling first and second power planes by a sufficient number of stitching capacitors according to an example. In block 810, input power from a motherboard is received at a voltage regulator module (VRM) of a memory module. For example, a memory module may include a contact pin to receive an input voltage of approximately 12 V to be delivered to the memory module VRM. In block 820, output power is provided from the VRM to components of the memory module on a first power plane. For example, the VRM provides power to the first power plane of approximately 1.2 V. In block 830, the first power plane is coupled by a sufficient number of stitching capacitors to a second power plane associated with at least one contact of the memory module, to maintain power isolation by a gap between the first and second power planes while allowing signals from the components to pass from the first power plane to the second power plane without signal integrity degradation. For example, the stitching capacitor provides an AC return signal path for components of the memory module, to pass across the gap between power planes and return to the motherboard via the contacts of the memory module.

What is claimed is:

1. A memory module comprising:
   a voltage regulator module (VRM) to receive input power, and provide output power to components of the memory module on a first power plane;
   an electrical gap to electrically isolate the first power plane from a second power plane associated with at least one contact of the memory module; and
   at least one stitching capacitor to couple the first power plane to the at least one contact associated with the second power plane, to allow return signals from the components to pass from the first power plane to the second power plane without signal integrity degradation;
   wherein the at least one contact comprises at least one finger pin contact to interface with a motherboard.

2. The memory module of claim 1, wherein the memory module is backward compatible with a motherboard that is capable of providing, to memory modules, the input power and the output power based on a multi-phase voltage regulator, wherein the gap is to isolate the memory module output power from that of the motherboard, and the memory module is based on a backward compatible form factor to interface with the motherboard.

3. The memory module of claim 1, wherein the VRM is to identify a reference value for setting the output voltage, based on substantially matching a motherboard output voltage within acceptable design tolerances.

4. The memory module of claim 1, wherein the signals allowed to pass by the at least one stitching capacitor include return current of memory address and command signals.

5. The memory module of claim 1, wherein the VRM is integrated with a serial presence detect (SPD) chip of the memory module.

6. The memory module of claim 1, wherein the VRM is integrated with a register chip of the memory module.

7. The memory module of claim 1, wherein the memory module is a double data rate, type four, synchronous dynamic random-access memory (DDR4 SDRAM) dual inline memory module (DIMM), including a power distribution network (PDN) contained on the memory module to distribute power from the VRM to the components of the memory module.

8. The memory module of claim 1, wherein the at least one stitching capacitor is appropriate to provide an AC signal return path without signal integrity degradation.

9. A system comprising:
a memory module, comprising:
a voltage regulator module (VRM) integrated with at least one of: a serial presence detect (SPD) chip, or a register chip, the VRM to receive input power and deliver output power to components of the memory module at a first power plane;
an electrical gap to electrically isolate the first power plane from a second power plane associated with at least one contact of the memory module; and
at least one stitching capacitor to couple the first power plane to the at least one contact associated with the second power plane, to allow return signals from the components to pass from the first power plane to the second power plane without signal integrity degradation; and
a motherboard including a single-phase voltage regulator to provide the input power to the memory module via a motherboard memory slot coupled to a motherboard power pad for power delivery by the second power plane, wherein the motherboard power pad has an appropriate size to accommodate the power associated with the components of the motherboard.

10. The system of claim 9, wherein the motherboard is to receive the AC return current of the command address signals from components of the memory module via at least one stitching capacitor of the memory module.

11. The system of claim 9, wherein the single-phase voltage regulator is to supply 10 Amp power to the VRM of the memory module, and the power pad is sized to accommodate the 10 Amp output of the single-phase voltage regulator.

12. A method, comprising:
receiving, at a voltage regulator module (VRM) of a memory module, input power from a motherboard;
providing, from the VRM, output power to components of the memory module on a first power plane; and
coupling, by at least one stitching capacitor, the first power plane to a second power plane associated with at least one contact of the memory module, to maintain power isolation by a gap between the first and second power planes while allowing signals from the components to pass from the first power plane to the second power plane without signal integrity degradation.

13. The method of claim 12, further comprising coupling, by the at least one stitching capacitor, return current of memory address and command signals from the components to the second power plane of the memory module.

14. A memory module comprising:
a voltage regulator module (VRM) to receive input power, and provide output power to components of the memory module on a first power plane;
an electrical gap to electrically isolate the first power plane from a second power plane associated with at least one contact of the memory module; and
at least one stitching capacitor to couple the first power plane to the at least one contact associated with the second power plane, to allow return signals from the components to pass from the first power plane to the second power plane without signal integrity degradation;
wherein the VRM is integrated with a serial presence detect (SPD) chip of the memory module.

15. A memory module comprising:
a voltage regulator module (VRM) to receive input power, and provide output power to components of the memory module on a first power plane;
an electrical gap to electrically isolate the first power plane from a second power plane associated with at least one contact of the memory module; and
at least one stitching capacitor to couple the first power plane to the at least one contact associated with the second power plane, to allow return signals from the components to pass from the first power plane to the second power plane without signal integrity degradation;
wherein the VRM is integrated with a register chip of the memory module.

* * * * *